United States Patent [19]
Dempewolf

[11] Patent Number: 5,936,777
[45] Date of Patent: *Aug. 10, 1999

[54] AXIALLY-GRADED INDEX-BASED COUPLERS FOR SOLAR CONCENTRATORS

[75] Inventor: Joseph P. Dempewolf, Albuquerque, N. Mex.

[73] Assignee: LightPath Technologies, Inc., Albuquerque, N. Mex.

[ * ] Notice: This patent is subject to a terminal disclaimer.

[21] Appl. No.: 08/976,414

[22] Filed: Nov. 21, 1997

Related U.S. Application Data

[63] Continuation-in-part of application No. 08/739,859, Oct. 31, 1996, Pat. No. 5,796,525, and a continuation-in-part of application No. 08/739,860, Oct. 31, 1996, Pat. No. 5,815,318.

[51] Int. Cl.⁶ .............................. G02B 3/00; G02B 13/08
[52] U.S. Cl. ........................... 359/653; 359/654; 359/668
[58] Field of Search ................................... 359/652–655, 359/668

[56] References Cited

U.S. PATENT DOCUMENTS 4,929,065  5/1990  Hagerty et al. .......................... 359/653
5,815,318  9/1998  Dempewolf et al. .................... 359/653

OTHER PUBLICATIONS

P.K. Manhard, "Optics and Photonics News", pp. 44–47, (Mar. 1985).

Xiaojie, J. Wu et al, Preparation of Macro Axial Gradient Refraction Glasses:, Gradient Index Optical Systems—Topical Meeting, Roshester, NY (Jun. 7–8, 1994).

*Primary Examiner*—Georgia Epps
*Assistant Examiner*—Evelyn A. Lester
*Attorney, Agent, or Firm*—Benman & Collins

[57] ABSTRACT

An optical coupler is provided that comprises a single lens component, comprising two axially-graded index of refraction elements, each having a low refractive index surface and a high refractive index surface and joined along their respective high refractive index surfaces. As configured, the optical coupler is useful as a solar concentrator for concentrating solar radiation onto a solar cell or other solar-receptive medium.

11 Claims, 10 Drawing Sheets

AXIALLY-GRADED INDEX-BASED COUPLERS FOR SOLAR CONCENTRATORS

CROSS-REFERENCE TO RELATED APPLICATION

The present application is a continuation-in-part of applications Ser. Nos. 08/739,859 and 08/739,860, both filed Oct. 31, 1996, now U.S. Pat. No. 5,796,525, issued Aug. 18, 1998, and U.S. Pat. No. 5,815,318, issued Sep. 29, 1998, respectively.

TECHNICAL FIELD

The present invention is directed to optical elements, and, more particularly, to couplers comprising axially-graded index-based elements for use in solar concentrators.

BACKGROUND ART

Couplers are optical elements that join a light source, such as a laser diode, a light-emitting diode, an optical fiber, or other light source, to a light collector, such as a photo detector, an optical fiber, an optoelectronic chip, an optical fiber, and the like.

Prior art couplers comprise either (1) homogeneous glass, or plastic lenses with either spherical, aspherical or cylindrical surfaces, (2) optical fibers and optical fiber based cylindrical lenses, (3) diffractive optic elements, (4) Fresnel lenses, or (5) radially-graded index of refraction glass cylinders or rods. The homogeneous glass, optical fiber based cylindrical, or plastic lenses require air space and have a low numerical aperture or light collection value, which results in less light being delivered to the collector than was incident on the coupling lens. In addition, homogeneous glass or plastic lenses are incapable of correcting for spherical aberration, which results in inefficient coupling, unless an aspheric surface is formed on the lens. Finally, multiple elements are often required in order to sufficiently couple the light.

The radially-graded index glass cylinder lenses when functioning with flat surfaces and focusing light at the lens exit surface, overcome one of the problems of homogeneous glass lenses. Further, the radially-graded index glass cylinder lenses comprise a single optical component, thereby overcoming another problem of homogeneous glass lenses. However, these radially-graded index glass cylinder lenses are incapable of correcting spherical aberrations or of forming small focal points, resulting in inefficient coupling performance. While coupling performance may be improved by forming a curved surface on the exit surface of the lens, the advantage of a flat surface is lost, and an air space is introduced into the coupling scheme. Radially graded index cylinder lenses when coupling light through their sides rather than their ends function with an air space requirement and lose the advantage of focusing light to a flat surface. Also, radially graded index lenses with flat surfaces lack sufficient batch to batch manufacturing reproducibility such that lenses performance varies so significantly that their effective focal length often varies too much to satisfy the strict manufacturing tolerance specifications necessary for many devices to be efficiently mass produced without coupling airspace. Additionally, radially graded index coupling lenses with curved surfaces have the disadvantage of requiring a varying degree of surface curvature in order to minimize the inherent spherical aberration introduced by the less than ideal profile of index change in these lenses that is limited by their manufacturing process requirements. Finally, radially graded index of refraction coupling lenses are limited in the amount of index change that can be placed into these lenses, which is several times less than what can be placed into the axially graded index lenses that are central to the invention to be described hereunder. Diffractive optical elements suffer from requiring long focal lengths and poor transmission efficiency when coupling a plurality of different wave-lengths. Fresnel lenses suffer from poor image quality and long focal length.

Solar concentrators are used as a conduit to direct incident sun light onto one or more solar cells, such as silicon-based solar cells or III-V multi-junction solar cells. The higher the concentration ratio, the smaller the solar concentrator and the higher the power output per volume or weight.

Solar concentrators employing gradient refractive index material are disclosed in U.S. Pat. Nos. 4,883,522, issued Nov. 28, 1989, and 4,907,864, issued Mar. 13, 1990. While these patents certainly represented an advance in the art of solar concentrators, efforts to further improve such solar concentrators have been on-going.

DISCLOSURE OF INVENTION

In accordance with the present invention, an optical coupler is provided that comprises a single lens component, comprising two axially-graded index of refraction elements, each having a low refractive index surface and a high refractive index surface and joined along their respective high refractive index surfaces. As configured, the optical coupler is useful as a solar concentrator for concentrating solar radiation onto a solar cell or other solar-receptive medium. Examples of other solar-receptive solid media include, but are not limited to, thermally conductive media used to absorb and transfer solar radiation as heat, and examples of other solar-receptive non-solid media include, but are not limited to, liquids in the form of water and gases such as air.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted.

FIG. 1b, on coordinates of refractive index and thickness, is a plot illustrating an exemplary index of refraction profile for the axial gradient lens shown in FIG. 1a;

FIG. 2b, on coordinates of refractive index and thickness, is a plot illustrating an exemplary index of refraction profile for the biaxial gradient lens shown in FIG. 2a;

BEST MODES FOR CARRYING OUT THE INVENTION

Reference is now made in detail to certain specific embodiments of the present invention, which illustrates the best modes presently contemplated by the inventor for practicing the invention. Alternative embodiments are also briefly described as applicable.

Axial gradient index of refraction lenses, sometimes referred to in the prior art as GRIN lenses, are flat glass slabs with a predesigned refractive index perturbation within it which provides the functionality of analog lens array; see, e.g., P. K. Manhart, *Optics and Photonics News*, pp. 44–47, (March 1995). The unique axial gradient lens fabrication technology available from LightPath Technologies, Inc. (Albuquerque, N. Mex.) has begun to revolutionize the imaging industry. The lenses are available under the trademark GRADIUM.

The fabrication of axial GRIN lens blanks has been described elsewhere; see, e.g., U.S. Pat. No. 4,929,065 and Xiaojie J. Xu et al, "Preparation of Macro Axial Gradient Refraction Glasses", *Gradient Index Optical Systems—Topical Meeting*, Rochester, N.Y. (Jun. 7–8, 1994), which disclose stacking a plurality of glass plates, each of a different composition, to form a stack, which is then fused at a sufficiently high temperature to cause interdiffusion of elements of the composition, thereby forming a unitary glass body. The particular profile of index of refraction, whether linear, parabolic, quadratic, cubic, etc., is achieved by control of the thicknesses and index of refractions (compositions) of the individual glass plates. Thus, a desired profile may be fabricated from a calculation of plate thickness and index of refraction, as taught in that patent.

In another approach, glass frits may be used to form the lens blank. In this case, the desired profile may be fabricated, based on the weight of frit having a particular index of refraction (composition). Knowing the density of a particular glass composition permits conversion of plate thickness to weight. This approach is the subject of a patent application, Ser. No. 08/441,275, filed May 15, 1995, now U.S. Pat. No. 5,630,857, issued May 20, 1997 and assigned to the same assignee as the present application.

The unitary glass body, or boule, that is formed by heating the glass plates or glass frits to a sufficiently high temperature for a period of time is then core-drilled to provide a plurality of glass blanks, which are then ground and polished to provide lenses. A variety of lens surfaces may be formed, including plano, concave, and convex, and combinations thereof.

Figure 1A:
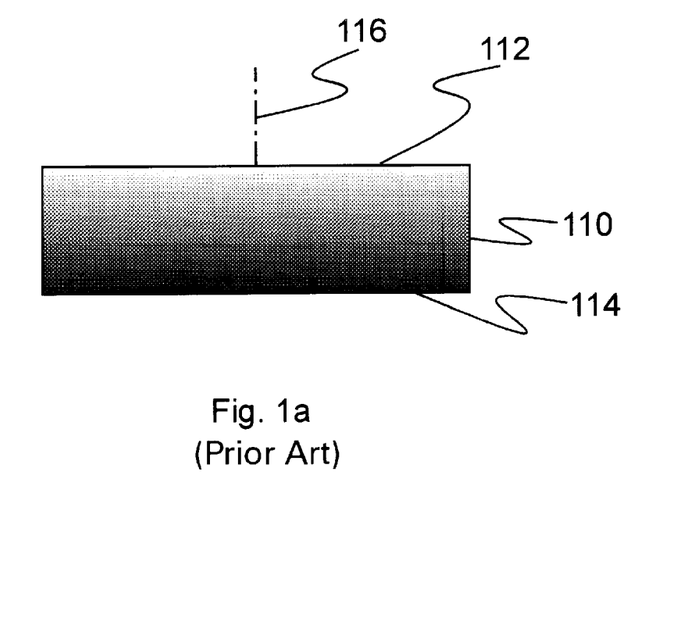
FIG. 1a depicts a prior art axial gradient lens with a prescribed variation of refractive index change.
Figure 1B:
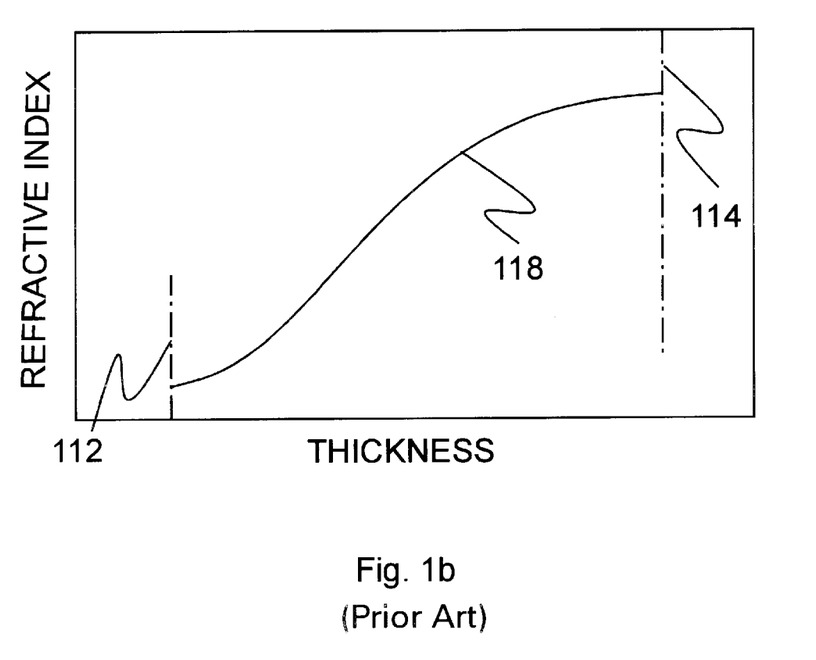

FIGS. 1a and 1b present a schematic illustration of the change in the refractive index along the axis 116 (across the cross-section). As shown in FIG. 1a, the glass blank 110 has a low index face 112 and a high index face 114. Face 112 of blank 110 is formed of a material having the lowest refractive index in the stack, while the opposite face 114 is formed of material having the highest refractive index. The index of refraction varies in some prescribed fashion between the two faces 112, 114. Preferably, the profile is parabolic. An example of a profile is depicted in FIG. 1b, which is a half-parabolic Curve 118.

The next step is to carefully orient, grind, and polish the low and high index faces 112 and 114, respectively, of the glass blank 110. The optical properties, such as gradient index profile, are also normally measured during this step.

After this, the blank 110 is cut, normal to the isoindex planes, into two pieces, each having the same dimensions. To produce the biaxial element, the two pieces are joined together with their high index faces 114 abutting. Joining may be done by use of an optical cement with a suitably matched index of refraction or by fusion, for example.

Figure 2A:
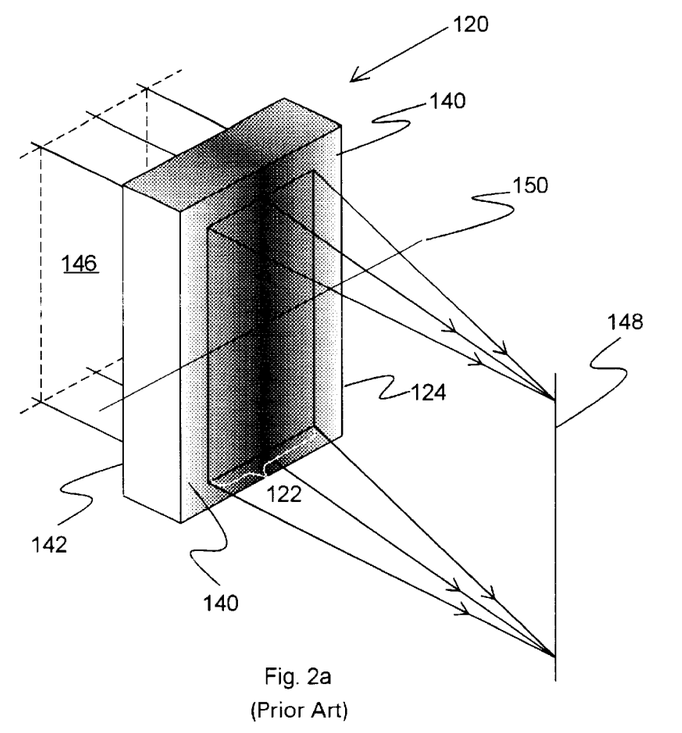
FIG. 2a depicts a prior art biaxial gradient lens comprising two axial lens elements, joined along their respective high index surfaces.

The biaxial gradient lens 140 has a gradient of refractive index only along one axis 150 orthogonal to the optical axis 152 of the lens. The lens 120 has flat front and back surfaces, 142 and 144, and can act as a cylindrical lens to focus light from a two-dimensional image 146 into a line 148.

Figure 2B:
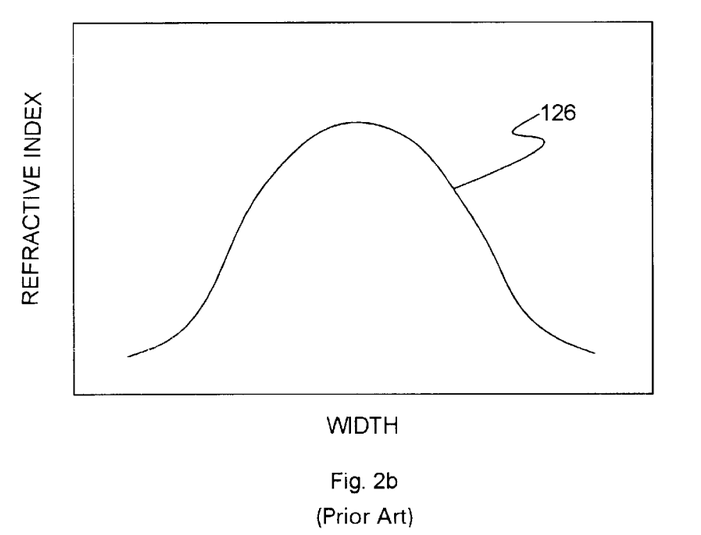

When the high index faces 114 are joined as shown, the resulting block 120 has a central zone 122 of material having a high refractive index. From this central zone 122, the index decreases towards the ends 124 of the block 120. The resultant profile of refractive index across the width of the block 120 is represented by Curve 126 in FIG. 2b. This Curve 126, as may be expected, is a combination of two of the Curves 118 illustrated in FIG. 1b. In order for the block 120 to act as a cylindrical axially-graded lens that focuses light into a line such as line 148 in FIG. 2a, the Curve 126 of the refractive index profile must be substantially quadratic or parabolic. However, other profile shapes may also be used for other applications.

Figure 3:
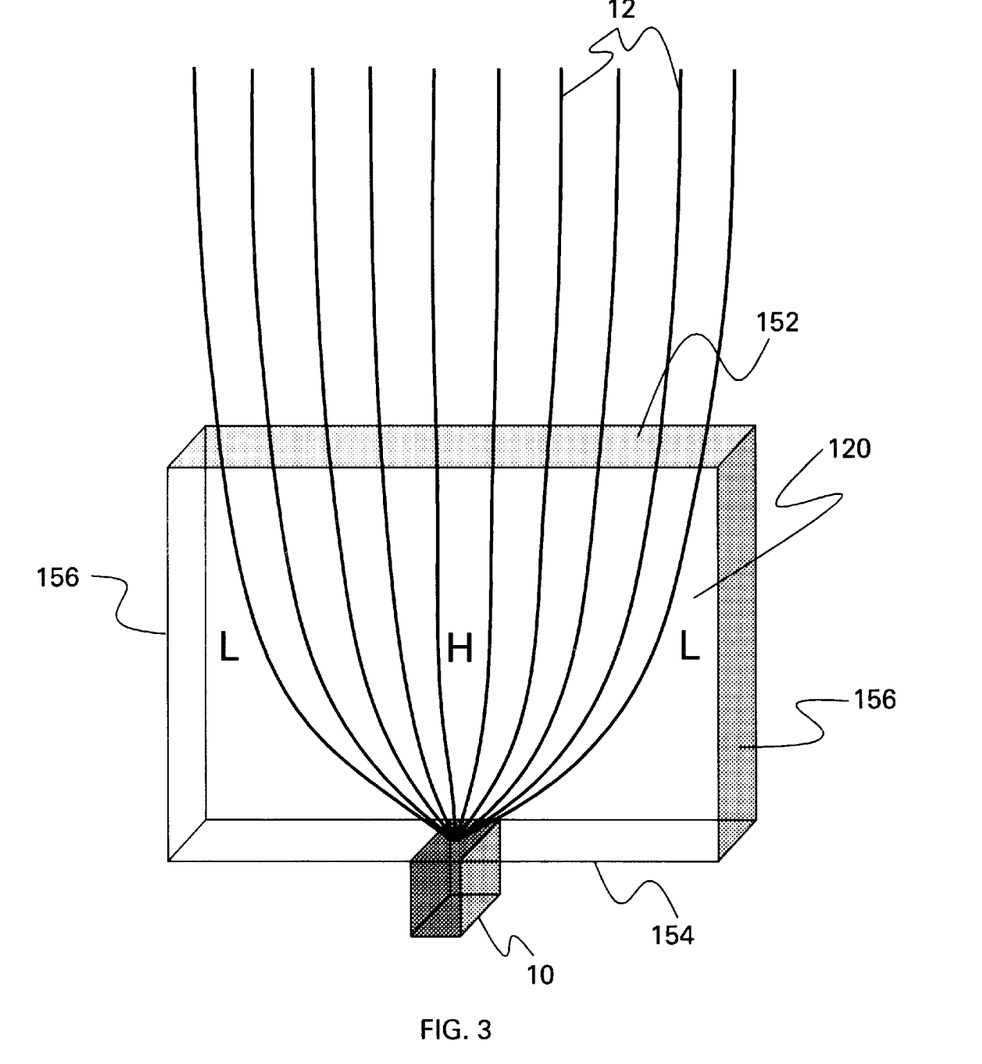
FIGS. 3–7 are schematic perspective views, depicting the biaxial gradient lens as a concentrator in conjunction with a solar cell and illustrating various top surface configurations, namely, flat (FIG. 3), spherical (FIG. 4), aspherical (FIG. 5), toroidal (FIG. 6), and cylindrical (FIG. 7)

In accordance with the present invention, the biaxial gradient lens 120 of FIG. 2a is employed as a concentrator of solar radiation in combination with a solar cell. FIG. 3 depicts the simple biaxial lens 120 combined with the solar cell 10. The solar cell 10 is affixed to the biaxial concentrator lens 120 by any conventional means, such as an appropriate optical cement.

For clarity, the graded shading has been omitted from this and subsequent Figures. However, the high index face is indicated as "H", while the low index face is indicated as "L". Due to the gradients on both sections of the biaxial lens, focusing of the incident solar rays 12 onto the solar cell 10 is accomplished.

The solar cell 10 may comprise any of the commonly-employed solar cells used to convert incident solar energy into electricity. Examples of such solar cells include silicon-based solar cells, whether crystalline, amorphous, or thin-film, and III-V compound semiconductor-based solar cells, such as GaInP/GaAs multijunction solar cells.

The biaxial concentrator lens 120 of the present invention may be provided with a number of different contours of its top surface 152, with its bottom surface 154 maintained flat for ease of affixing the solar cell 10 to the lens. FIG. 3 depicts a flat top surface 152, parallel to the bottom flat surface 154.

Figure 4:
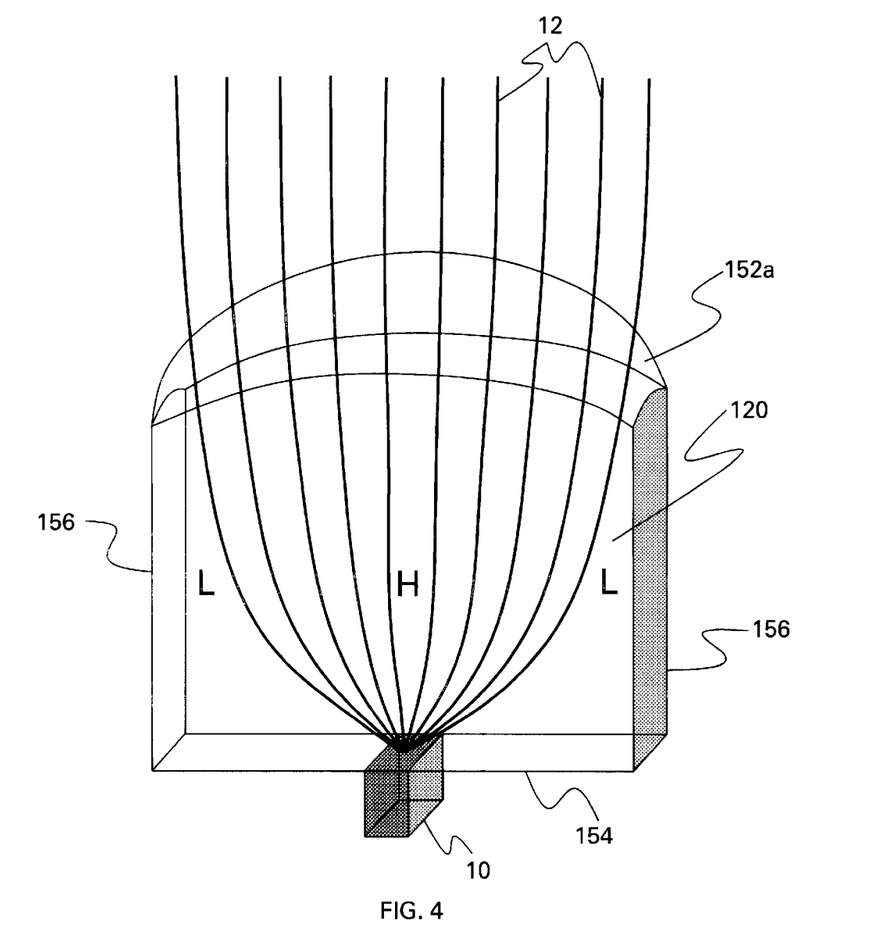

FIG. 4 depicts the biaxial concentrator lens with a spherical top surface 152a. The advantage of a spherical top surface is that it causes the lens to concentrate the solar radiation to a 3-dimensional spot rather than to a 2-dimensional line.

Figure 5:
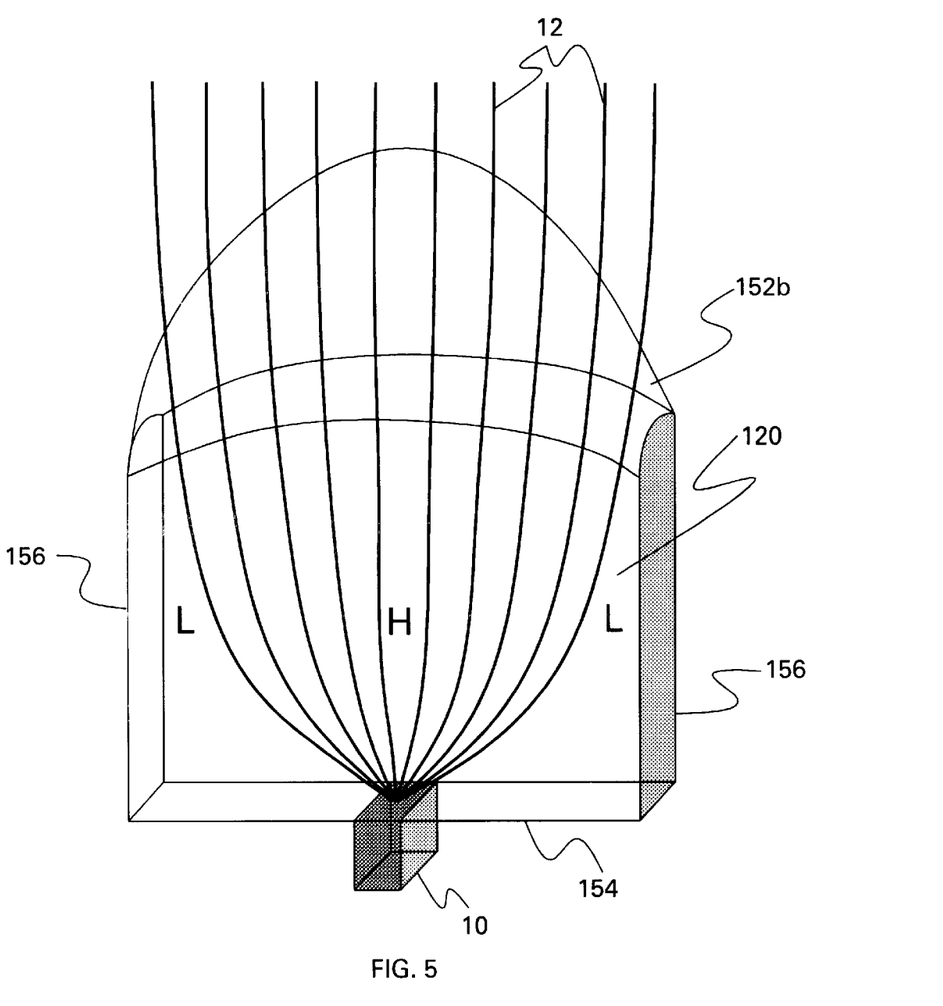

FIG. 5 depicts the biaxial concentrator lens with an aspherical top surface 152b. An aspherical top surface offers the lens designer the ability to compensate for a less than ideal distribution of refractive index change in the body of the lens.

Figure 6:
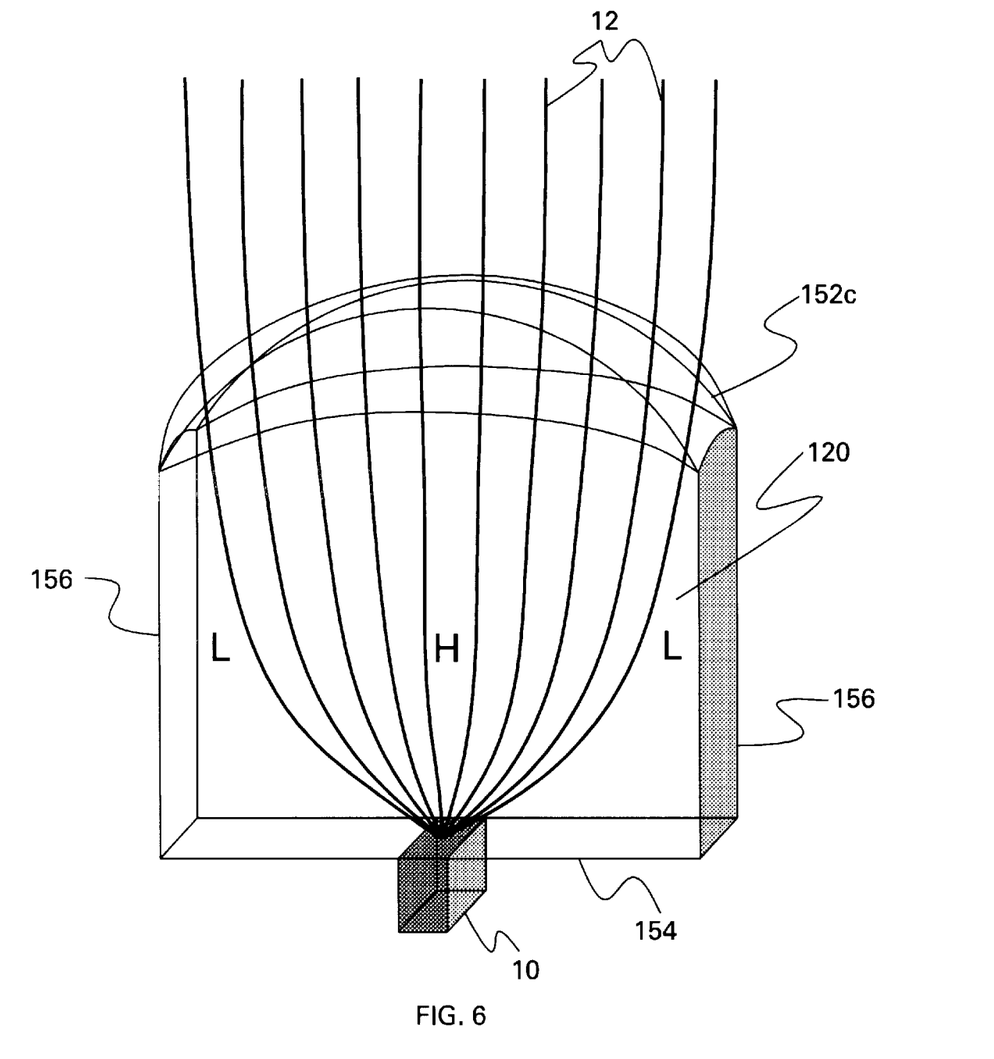

FIG. 6 depicts the biaxial concentrator lens with a toroidal surface 152c. A toroidal top surface offers the advantage of maximizing the acceptance angle of the biaxial concentrator lens to be able to receive solar radiation from near the sunrise angle to near the sunset angle and focusing to a 2-dimensional line of concentrated solar radiation.

Figure 7:
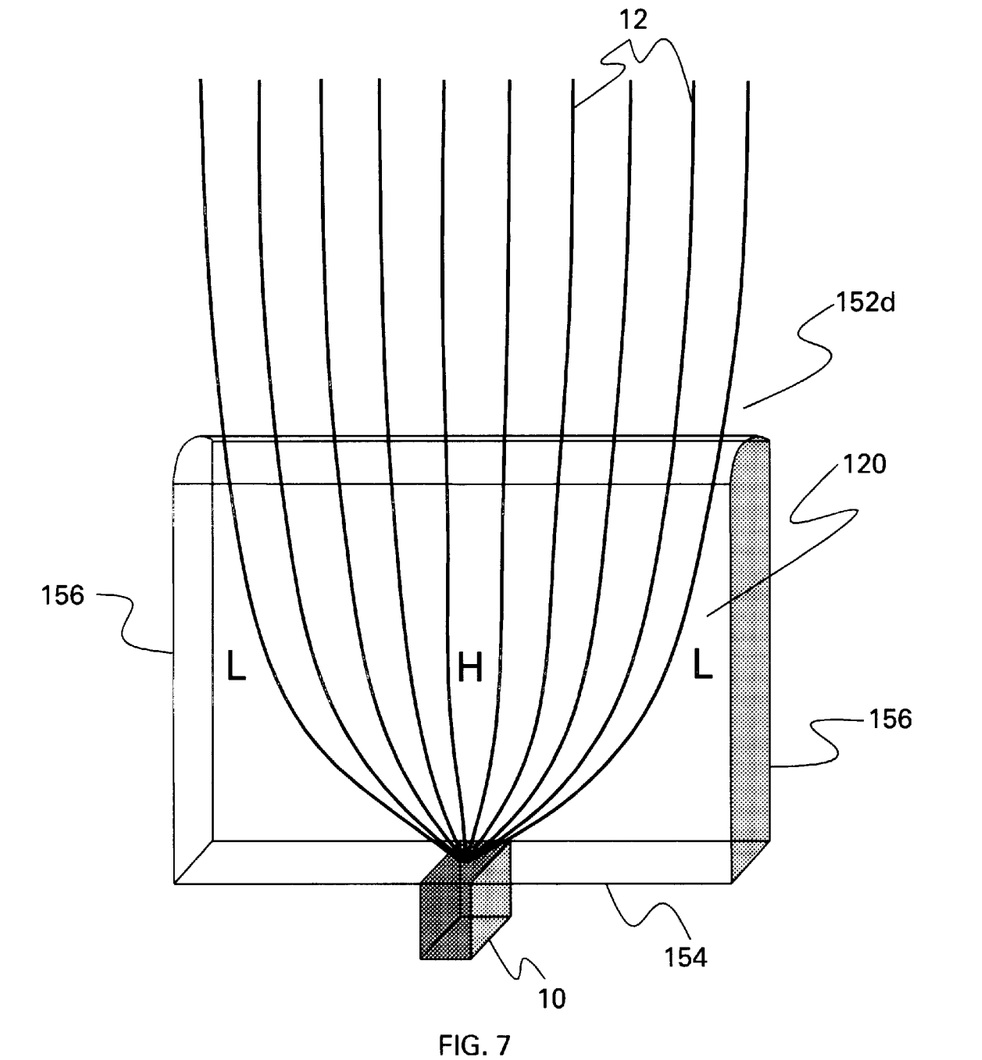

FIG. 7 depicts the biaxial concentrator lens with a cylindrical top surface 152d. A cylindrical top surface offers the advantage of enabling the lens to concentrate light to a 3-dimensional spot rather than to a 2-dimensional line.

In addition to the various top surfaces 152a–d described above, the biaxial concentrator lens may be provided with side walls 156 of various configurations. FIG. 3 depicts side walls 156 that are flat and parallel to each other. A 2-dimensional line of concentration is obtained on the bottom surface 154.

Figure 8:
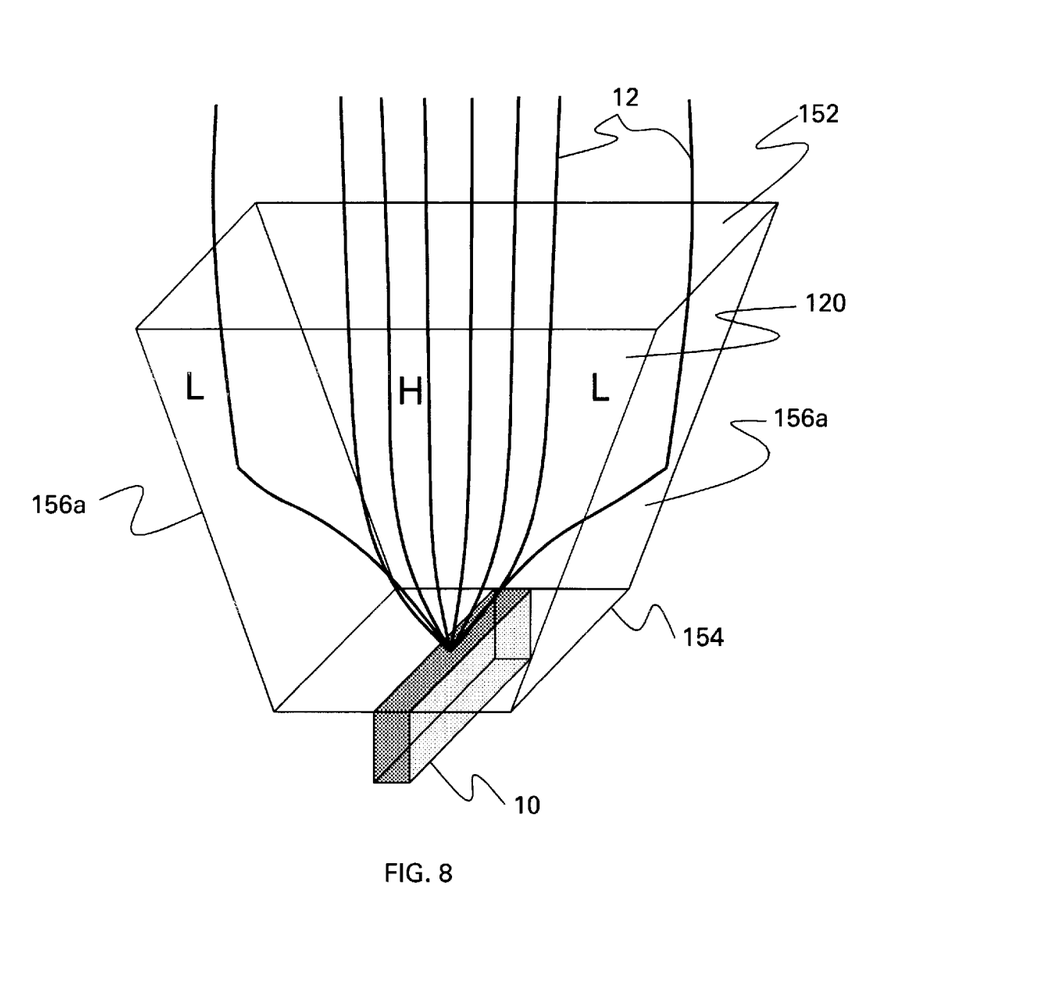
FIGS. 8–10 are schematic perspective views, depicting the biaxial gradient lens as a concentrator in conjunction with a solar cell and illustrating various side configurations, namely, flat (FIG. 8), segmented flat (FIG. 9), and parabolic (FIG. 10).

FIG. 8 depicts side walls 156a that are formed at an angle such that the top surface 152 is wider than the bottom surface 154. In this embodiment, the side walls 156a are preferably provided with a mirror surface, such as by the deposition of an aluminum or silver film thereon, employing well-known metal deposition techniques for forming mirrored surfaces on glass. The advantage of the side walls 156a being flat with the top surface 152 being wider than the bottom surface 154 is that certain off-axis rays then enter the lens at an angle greater than the acceptance angle or numerical aperture value of the lens can reflect off its mirrored surface or as a function of total internal reflection enter the body of the lens, wherein the changing index of refraction in concert with the angle of reflection off the reflected surface contributes to the formation of the 2-dimensional line of concentrated solar radiation that is obtained with the vertical walls 156 of the lens 120 shown in FIG. 3.

Figure 9:
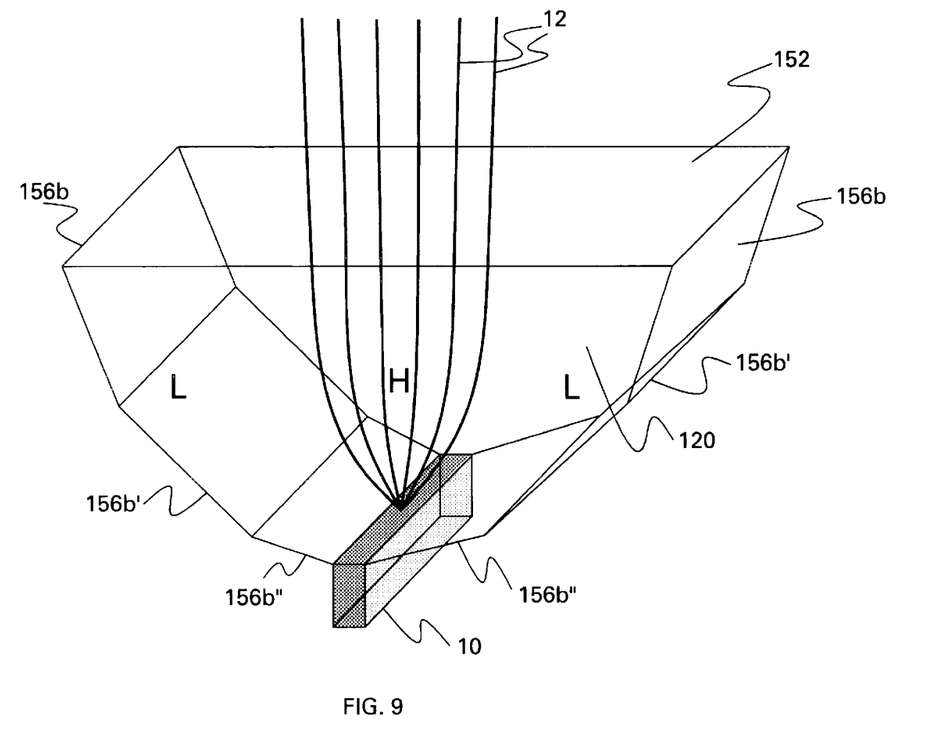

FIG. 9 depicts side walls 156b, 156b′, 156b″ that comprise a plurality of flat surfaces, each tending inward toward the bottom surface 154. The advantage of this multi-segmented set of flat surfaces is that it enables the lens to reflect off-axis rays of more variety of angular distribution into the body of the lens where they are steered by the changing index of refraction to form part of a 2-dimensional line of concentrated solar radiation.

Figure 10:
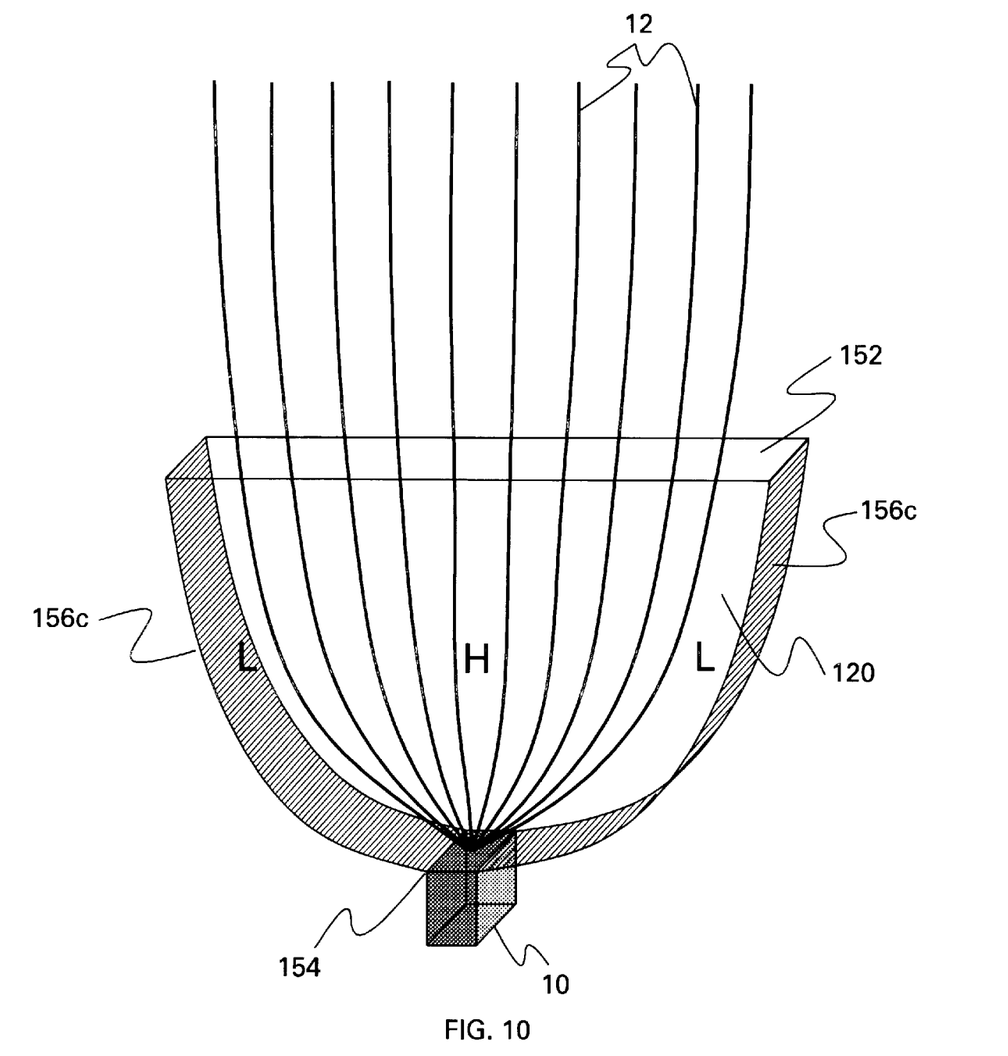

FIG. 10 depicts side walls 156c that comprise parabolic walls tending inward toward the bottom surface 154. The advantage of a parabolic side wall lens shape is that the maximum distribution of off-axis solar rays comprising different angles of propagation greater than the numerical aperture may enter the lens and reflect off the parabolic walls and form a 2-dimensional line of concentration.

In any of the foregoing biaxial concentrator lenses 120 of the present invention, it appears that the preferred profile is a parabolic profile. The parabolic profile is preferred for replicating a concave curved entrance surface. The Δn employed may be any reasonable value, with the caveat that a smaller Δn only requires a larger overall lens size.

The biaxial lens 120 may be arranged to form long rectangular lenses the length or width of conventional solar panels, up to 1 meter or more square.

The biaxial solar concentrator lens 120 may focus at the exit surface 154 of the lens and avoid the requirement for air space between it and the photovoltaic cell 10.

The biaxial solar concentrator lens 120 may be given added field of view or solar radiation acceptance angle as a function of increased numerical aperture by extending reflective surfaces in the space above the lens, as is well-known for concentrator troughs. This relaxes the requirement for accurate solar tracking and utilizes the well-known non-imaging principle established in prior art publications by Roland Winston and others. By extending the reflective surface above the lens 120, the effective numerical aperture value of the lens is increased, resulting in a higher photovoltaic output. The same principle may be utilized as is well-known by those skilled in the art to reflect light into a biaxial concentrator lens with a spherical top shape to focus to a 3-dimensional spot of concentrated solar radiation instead of a 2-dimensional line.

In order to achieve both minimum size and maximum field of view or greatest acceptance angle, the preferred embodiment of the present invention is defined as having a curved top surface and curved sides. The exact prescription of the top surface curvature will take a toroidal, spherical, or cylindrical shape, depending upon the orientation of the photovoltaic cell 10. The side walls of the biaxial solar concentrator preferably have a parabolic shape.

The preferred embodiment of the present invention will also have a large change in index of refraction that is non-linearly distributed from the center 122 of the lens 120, where the two axially graded elements with a parabolic distribution are joined, to the low index at the exterior sides 124 of the lens. The higher the Δn, the thinner the lens.

In order to achieve the maximum lens performance merit at the minimum cost, deviations from the preferred embodiment may have a flat top surface 152 and flat side surfaces 154.

The axially-graded index-based concentrators of the invention are expected to find use in terrestrial- and space-based solar energy applications, for focusing solar energy onto a solar cell.

Thus, there has been disclosed an axially-graded index-based concentrator. It will be readily apparent to those skilled in this art that various changes and modifications of an obvious nature may be made, and all such changes and modifications are considered to fall within the scope of the present invention, as defined by the appended claims.

What is claimed is:

1. An optical coupler for coupling solar radiation to a solar-receptive medium, said optical coupler comprising a single component having a top entrance surface on which said solar radiation is incident and a bottom exit surface to which said solar cell is attached and an optical axis therebetween, said single component comprising a biaxially graded index of refraction element comprising two axially graded index of refraction sub-elements, each said sub-element having a gradient in index of refraction that beginning at a lower value on one surface and ending at a higher value on an opposite surface, with both said sub-elements joined together at said surfaces having said higher value of index of refraction, said joined surfaces perpendicular to said entrance and exit surfaces.

2. The optical coupler of claim 1 wherein said solar-receptive medium comprises at least one solar cell.

3. The optical coupler of claim 2 wherein said at least one solar cell is selected from the group consisting of silicon-based solar cells and III–V compound semiconductor-based solar cells.

4. The optical coupler of claim 3 wherein said at least one solar cell is selected from the group consisting of thin film solar cells and multijunction GaInP/GaAs solar cells.

5. The optical coupler of claim 1 wherein said top surface of said single component is selected from the group of surfaces consisting of flat, spherical, aspherical, toroidal, and cylindrical.

6. The optical coupler of claim 1 wherein said single component includes side surfaces joining said top and bottom surfaces and wherein said side surfaces are selected from the group of surfaces consisting of flat, segmented flat, and parabolic.

7. In combination, a solar concentrator and a solar cell, said solar concentrator adapted to couple solar radiation to said solar cell, said solar concentrator comprising a single component having a top entrance surface on which said solar radiation is incident and a bottom exit surface to which said solar cell is attached and an optical axis therebetween, said solar concentrator comprising a biaxially graded index of refraction element comprising two axially graded index of refraction sub-elements, each said sub-element having a gradient in index of refraction that beginning at a lower value on one surface and ending at a higher value on an opposite surface, with both said sub-elements joined together at said surfaces having said higher value of index of refraction, said joined surfaces perpendicular to said entrance and exit surfaces.

8. The combination of claim 7 wherein said solar cell is selected from the group consisting of silicon-based solar cells and III–V compound semiconductor-based solar cells.

9. The combination of claim 8 wherein said at least one solar cell is selected from the group consisting of thin film solar cells and multijunction GaInP/GaAs solar cells.

10. The combination of claim 7 wherein said top surface of said single component is selected from the group of surfaces consisting of flat, spherical, aspherical, toroidal, and cylindrical.

11. The combination of claim 7 wherein said single component includes side surfaces joining said top and bottom surfaces and wherein said side surfaces are selected from the group of surfaces consisting of flat, segmented flat, and parabolic.

* * * * *